(12) United States Patent
Takada

(10) Patent No.: US 8,415,681 B2
(45) Date of Patent: Apr. 9, 2013

(54) SEMICONDUCTOR LIGHT EMITTING DEVICE AND MULTIPLE LEAD FRAME FOR SEMICONDUCTOR LIGHT EMITTING DEVICE

(75) Inventor: Toshiyuki Takada, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 652 days.

(21) Appl. No.: 12/046,896

(22) Filed: Mar. 12, 2008

(65) Prior Publication Data

US 2008/0224161 A1 Sep. 18, 2008

(30) Foreign Application Priority Data

Mar. 13, 2007 (JP) ................................. 2007-063698

(51) Int. Cl.
*H01L 33/00* (2010.01)
(52) U.S. Cl. ............... 257/79; 257/98; 257/99; 257/100
(58) Field of Classification Search .................... 257/79, 257/80, 81, 88, 98–100; 438/22, 26, 29, 438/42
See application file for complete search history.

(56) References Cited

U.S. PATENT DOCUMENTS

| | | | |
|---|---|---|---|
| 5,177,593 A | 1/1993 | Abe | |
| 5,496,766 A | 3/1996 | Amano et al. | |
| 6,180,962 B1 | 1/2001 | Ishinaga | |
| 6,345,903 B1 | 2/2002 | Koike et al. | |
| 6,393,222 B1 | 5/2002 | Nakagawa et al. | |
| 6,624,491 B2 | 9/2003 | Waitl et al. | |
| 6,707,247 B2 | 3/2004 | Murano | |
| 6,774,405 B2 | 8/2004 | Yasukawa et al. | |
| 2002/0134988 A1 | 9/2002 | Ishinaga | |
| 2003/0080341 A1 | 5/2003 | Sakano et al. | |
| 2003/0178691 A1 | 9/2003 | Wang et al. | |
| 2004/0159850 A1 | 8/2004 | Takenaka | |
| 2005/0224821 A1 | 10/2005 | Sakano et al. | |
| 2006/0220048 A1* | 10/2006 | Matsumoto et al. | ............ 257/98 |
| 2006/0249746 A1* | 11/2006 | Oshio | ............... 257/99 |

FOREIGN PATENT DOCUMENTS

| | | |
|---|---|---|
| JP | 7-15044 A | 1/1995 |
| JP | 7-235696 | 9/1995 |
| JP | 2002-141558 | 5/2002 |

(Continued)

OTHER PUBLICATIONS

U.S. Office Action mailed Nov. 29, 2005 in corresponding U.S. Appl. No. 10/782,331.

(Continued)

*Primary Examiner* — Ha Tran T Nguyen
*Assistant Examiner* — Suberr Chi
(74) *Attorney, Agent, or Firm* — Nixon & Vanderhye P.C.

(57) ABSTRACT

A semiconductor light emitting device that is excellent in radiating heat and that can be molded into a sealing shape having intended optical characteristics by die molding is provided. The semiconductor light emitting device includes: a lead frame including a plate-like semiconductor light emitting element mounting portion having an LED chip mounted on a main surface, and a plate-like metal wire connecting portion extending over a same plane as the semiconductor light emitting element mounting portion; a metal wire electrically connecting the LED chip and the metal wire connecting portion; a thermosetting resin molded by die molding or dam-sheet molding so as to completely cover the LED chip and the metal wire; and a resin portion provided to surround the lead frame and having the thickness not greater than the thickness of the lead frame.

9 Claims, 14 Drawing Sheets

FOREIGN PATENT DOCUMENTS

| | | | |
|---|---|---|---|
| JP | 2003-318449 | A | 11/2003 |
| JP | 2004-274027 | | 9/2004 |
| JP | 2006-313943 | A | 11/2006 |
| KR | 2002-0079953 | A | 10/2002 |

OTHER PUBLICATIONS

U.S. Office Action mailed Oct. 2, 2006 in corresponding U.S. Appl. No. 10/782,331.

U.S. Office Action mailed Apr. 18, 2007 in corresponding U.S. Appl. No. 10/782,331.

U.S. Office Action mailed Dec. 21, 2007 in corresponding U.S. Appl. No. 10/782,331.

U.S. Office Action mailed Jun. 26, 2008 in corresponding U.S. Appl. No. 10/782,331.

* cited by examiner

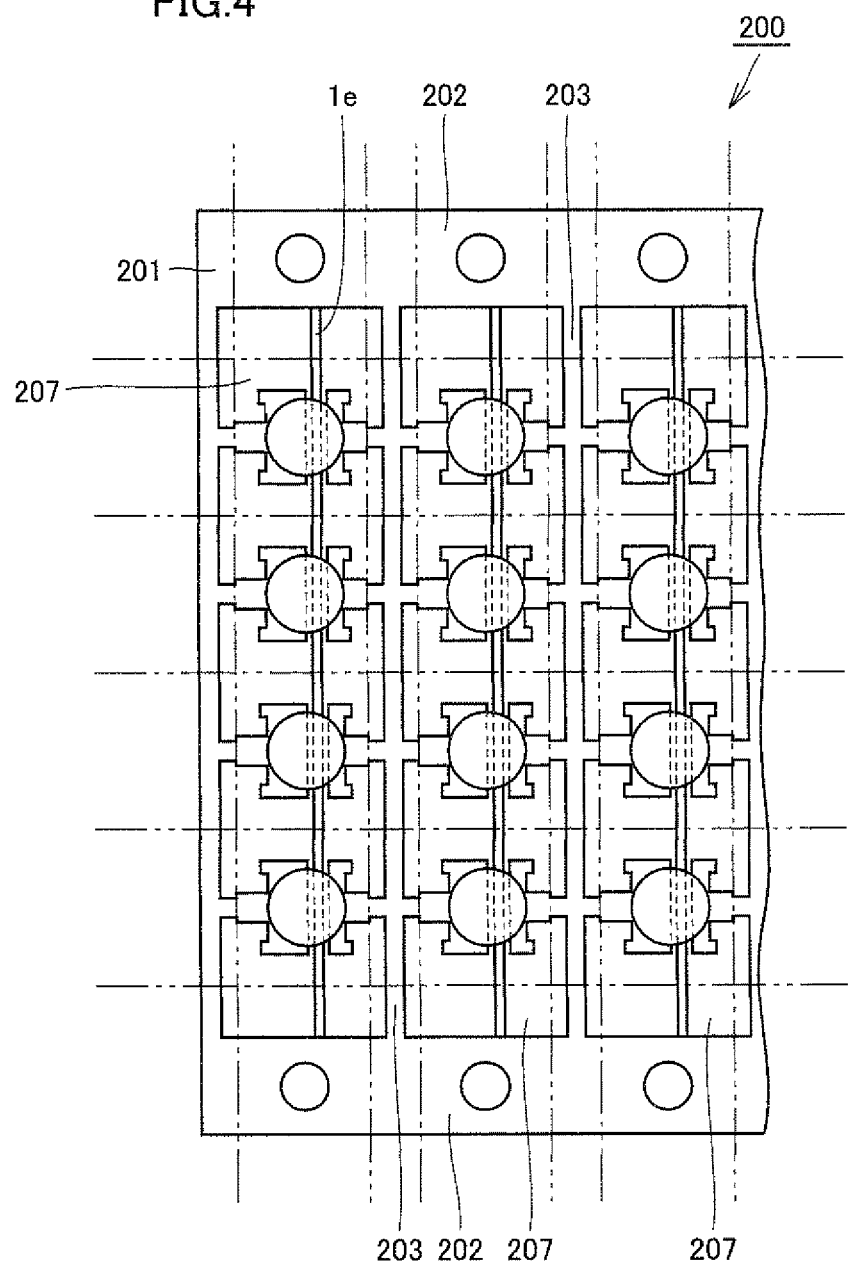

FIG.5A
FIG.5B
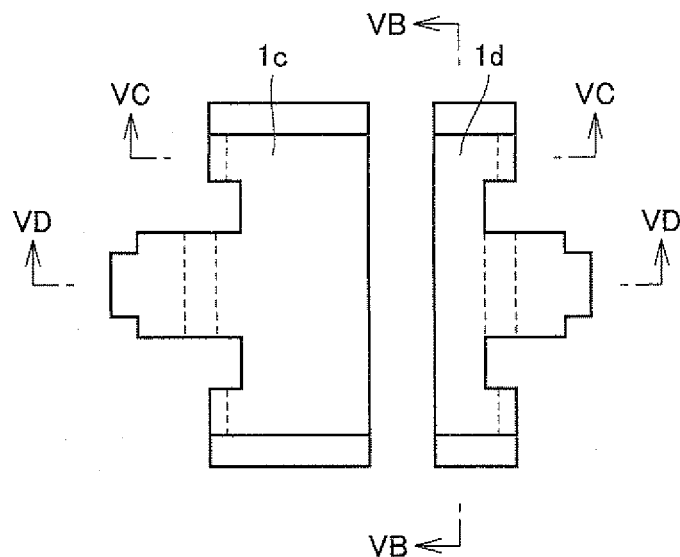
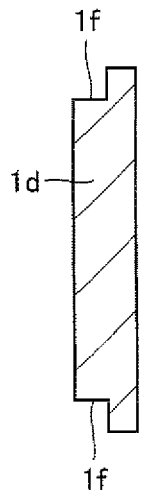
FIG.5C
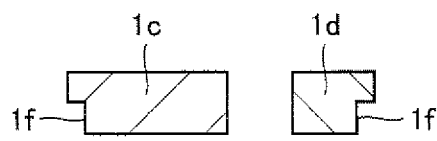
FIG.5D
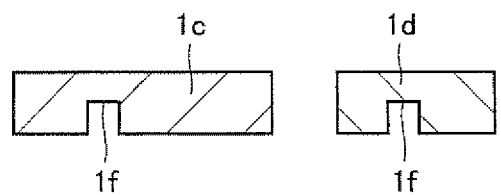

SEMICONDUCTOR LIGHT EMITTING DEVICE AND MULTIPLE LEAD FRAME FOR SEMICONDUCTOR LIGHT EMITTING DEVICE

This nonprovisional application is based on Japanese Patent Application No. 2007-063698 filed with the Japan Patent Office on Mar. 13, 2007, the entire contents of which are hereby incorporated by reference.

BACKGROUND

1. Field of the Technology

The technology presented herein relates to a semiconductor light emitting device on which a semiconductor light emitting element is mounted, and a multiple lead frame for a semiconductor light emitting device.

2. Description of the Background Art

Conventional semiconductor light emitting devices are disclosed in, for example, Japanese Patent Laying-Open Nos. 2004-274027, 07-235696 and 2002-141558. As shown in FIG. 21, a conventional semiconductor light emitting device includes a lead frame 101 having a main surface 101a, an LED (Light Emitting Diode) chip 104 provided on main surface 101a, a metal wire 105 connecting lead frame 101 and LED chip 104, epoxy resin 106 provided on main surface 101a so as to completely cover LED chip 104 and metal wire 105, and a resin portion 103 provided so as to surround epoxy resin 106.

Resin portion 103 is provided around lead frame 101 by insert molding, for example. Resin portion 103 forms a concave shape on main surface 101a. LED chip 104 is mounted on main surface 101a, with a silver (Ag) paste 107 interposed, to be located inside the concave shape. An electrode formed on the top surface of LED chip 104 is connected to main surface 101a of lead frame 101 via metal wire 105. Epoxy resin 106 is provided on main surface 101a so that LED chip 104 and metal wire 105 are covered and the concave shape is completely filled therewith.

A manufacturing method of the semiconductor light emitting device shown in FIG. 21 is now described. Firstly, plate-like lead frame 101 is processed into a prescribed pattern. Lead frame 101, plated with silver (Ag), is insert-molded in resin portion 103. Thereafter, LED chip 104 is mounted on main surface 101a with silver paste 107 being interposed. LED chip 104 and main surface 101a are electrically connected via metal wire 105. Thereafter, LED chip 104 and metal wire 105 are sealed with epoxy resin 106. Lastly, a lead terminal projecting into the periphery and extending in a prescribed direction is cut so as to be cut away from unnecessary portions of lead frame 101.

Resin portion 103 shown in FIG. 21 plays the role of controlling directivity of light by reflecting the light emitted from LED chip 104 with the concave-shaped sidewall, and also the role of keeping the shape of lead frame 101 having formed in a prescribed pattern. In the step of resin-sealing LED chip 104 and metal wire 105, liquid epoxy resin 106 is dropped into the concave shape formed by resin portion 103 and thereafter cured. However, according to this method, the shape of epoxy resin 106 is limited to the shape of the concave shape formed by resin portion 103, and the optical characteristics by the shape of resin sealing cannot be controlled. Further, dropped epoxy resin 106 tends to be affected by its viscosity, and therefore the filling amount may be varied. Additionally, there are the effect of vaporization of volatile component or cure shrinkage during thermal curing. Therefore, it is difficult to ensure uniform sealing shape.

When epoxy resin 106 and resin portion 103 are adhered to each other as in the conventional technique, since adhesion force between epoxy resin 106 and resin portion 103 is weak, they may possibly be peeled off from each other after molding and the optical characteristics may be impaired. In fact, it has been observed in a long-term aging test that an optical characteristics defect occurs due to peeling between epoxy resin 106 and resin portion 103.

For stabilizing the sealing shape of epoxy resin 106 and for molding into various sealing shapes, molding using a die (die molding) may be employed. In order to perform die molding, it is necessary for the front and rear surfaces of lead frame 101 to be flat. However, as resin portion 103 is protruding on main surface 101a of lead frame 101, clamping of the die is difficult. Japanese Patent Laying-Open No. 2004-274027 also discloses die molding in a state where resin portion 103 protrudes on main surface 101a of lead frame 101 (see paragraph 0059 of the specification of Japanese Patent Laying-Open No. 2004-274027). However, sealing only the periphery of LED chip 104 with epoxy resin 106 is difficult because of the limited clamping region and in consideration of keeping the region for resin gate and runner.

A metal core substrate, a ceramic substrate or the like that can be formed to have a flat surface may be employed for performing die molding. However, while the ceramic substrate is higher in thermal conductivity than a conventional resin substrate such as a glass epoxy substrate (for example, about 20 W/m·K in the case of alumina), the unit price of the substrate is increased. Also, there is a disadvantage that it is easily damaged when clamped by the die. On the other hand, the metal core substrate requires an insulating layer to be provided between the substrate pattern and the metal being the core. This insulating layer reduces the thermal conductivity. That is, there has been no lead frame provided that have the thermal conductivity of the same level as that of a metal frame and that can be die-molded.

SUMMARY OF THE INVENTION

A primary feature of an example embodiment presented herein is to provide a semiconductor light emitting device and a multiple lead frame for a semiconductor light emitting device, which are excellent in heat radiation and which is easily applied to die molding for ensuring the sealing shape having intended optical characteristics.

A semiconductor light emitting device according to the present embodiment includes: a lead frame including a plate-like semiconductor light emitting element mounting portion having a semiconductor light emitting element mounted on a main surface, and a plate-like metal wire connecting portion extending over a same plane as the semiconductor light emitting element mounting portion; a metal wire electrically connecting the semiconductor light emitting element and the metal wire connecting portion; a sealing resin molded by die molding or dam-sheet molding so as to completely cover the semiconductor light emitting element and the metal wire; and an insulator provided so as to surround the lead frame and having thickness not greater than thickness of the lead frame.

The semiconductor light emitting device configured as above have the structure in which the semiconductor light emitting element is mounted on the main surface of the lead frame made by metal having great thermal conductivity, and there is no material of great thermal resistance such as an insulating substrate interposed in a heat radiation route for radiating heat generated by the semiconductor light emitting element to the outside. Accordingly, the semiconductor light emitting device that is excellent in radiating heat can be formed. Additionally, as the thickness of the insulator is not greater than the thickness of the lead frame, a flat surface having no projection on the main surface of the semiconductor light emitting device can be formed.

Accordingly, as a method of sealing the semiconductor light emitting element, die molding using liquid or solid resin can easily be incorporated, in addition to a conventional potting method where liquid resin is dropped. When potting is employed, dam-sheet molding can be incorporated. This allows the sealing resin to be molded into a sealing shape based on the optical characteristics required for the product, such as a cylindrical shape, a dome shape or the like.

Furthermore, since resin is allowed to cure inside the die or the dam sheet, the conventional problems in liquid resin sealing can be suppressed, such as variations in the dropping amount attributed to a change in viscosity and variations in the sealing shape attributed to vaporization of volatile component during curing or cure shrinkage.

Desirably, the insulator is thermoplastic resin or thermosetting resin. Then, the insulator can easily be molded.

Desirably, a concave portion is formed at least at the semiconductor light emitting element mounting portion on the main surface of the lead frame, and the semiconductor light emitting element is mounted on a bottom surface of the concave portion. Then, by providing the semiconductor light emitting element on the bottom surface of the concave portion, a product having the optical characteristics that cannot be controlled solely by the shape of the sealing resin, in particular, having higher directivity characteristics than a semiconductor light emitting device without concave portion, can be obtained.

Desirably, the lead frame has a wedge structure for preventing the insulator from peeling. Then, by pouring the insulator into the wedge structure when molding the insulator, peeling or removal of the insulator from the lead frame can be prevented.

Desirably, the semiconductor light emitting device further includes a lead terminal projecting from periphery of the insulator into a side away from the semiconductor light emitting element. While cutting processing is performed for singulating the semiconductor light emitting device in the manufacturing process of the semiconductor light emitting device, with the semiconductor light emitting device configured as above, cutting by the die can be performed, in addition to the conventional dicing method. Oxidation of the cutting surface of metal disadvantageously reduces wettability to solder (that is, in soldering, the solder alloy having the function of bonding and the portion to be bonded becomes less conformable to each other, and the solder becomes granular on the surface to be bonded). In the semiconductor light emitting device of the present invention, as the lead terminal projects from the insulator) margin for solder can be ensured not only at the cutting surface but also at the side surface of the lead terminal. Thus, reduction in solder wettability can be avoided.

Desirably, the semiconductor light emitting device further includes a reflector provided on the main surface so as not to contact the sealing resin, or a reflector provided on a side away from the semiconductor light emitting element relative to periphery of the insulator. With the semiconductor light emitting device configured as above, the optical characteristics that cannot be controlled solely by the shape of the sealing resin sealing the semiconductor light emitting element can be obtained. At the same time, it becomes possible to extract the light generated by the semiconductor light emitting element to the outside more efficiently.

A multiple lead frame for a semiconductor light emitting device according to the present invention includes a lead frame base member formed by a plurality of the lead frames constituting the semiconductor light emitting device. The multiple lead frame for the semiconductor light emitting device further includes an insulator base member, with which all gaps formed in the lead frame base member so as to surround the lead frame are filled, and which is to be the insulator constituting the semiconductor light emitting device. The multiple lead frame for the semiconductor light emitting device is formed into a substrate-like form.

Then, by cutting the multiple lead frame for the semiconductor light emitting device along the outer shape of the semiconductor light emitting devices linearly arranged, the semiconductor light emitting devices can be singulated. That is, by cutting and separating the multiple lead frame for the semiconductor light emitting device formed by a plurality of lead frames and insulators constituting the semiconductor light emitting devices by a rotary blade, laser or the like, a plurality of semiconductor light emitting devices each having single lead frame and single insulator surrounding the lead frame can be obtained.

Another multiple lead frame for a semiconductor light emitting device according to the present invention includes a lead frame base member formed by a plurality of the lead frames constituting the semiconductor light emitting device. The multiple lead frame for the semiconductor light emitting device further includes an insulator base member, with which gaps formed in the lead frame base member so as to surround the lead frame are filled, and which is to be the insulator constituting the semiconductor light emitting device. The multiple lead frame for the semiconductor light emitting device is formed into a substrate-like form. A groove structure not being filled with the insulator base member is formed in part of the gaps.

Then, when cutting the multiple lead frame for the semiconductor light emitting device, cutting can be performed by a cutting die. Cutting the metal portion of the multiple lead frame for the semiconductor light emitting device by the cutting die and cutting the resin portion as an insulator by dicing, the cutting defect such as burr generated when the metal and resin are cut at the same time by dicing can be prevented. Furthermore, as the characteristics test of the semiconductor light emitting device can be performed not only for each singulated semiconductor light emitting device but also for each multiple lead frame, the production efficiency can be improved.

Desirably, the insulator base member is formed by a plurality of individual insulators. Then, a plurality of insulators can be molded at the same time. When the insulator is resin, the insulator base member can easily be cut and separated by dicing.

Desirably, the lead frame base member has a key structure for preventing the insulator base member from being disconnected. Then, the joining force between the lead frame base member and the insulator base member can be improved, and therefore the insulator base member is prevented from being separated and disconnected from the lead frame even when the lead frame base member is cut by the die.

Still another multiple lead frame for a semiconductor light emitting device according to the present invention includes a lead frame base member formed by a plurality of the lead frames constituting the semiconductor light emitting device. The multiple lead frame for the semiconductor light emitting device further includes an insulator base member, with which gaps formed in the lead frame base member so as to surround the lead frame are filled, and which is to be the insulator constituting the semiconductor light emitting device. The multiple lead frame for the semiconductor light emitting device is formed into a substrate-like form. The lead frame base member has a skeleton frame, and the insulator base member is divided by the skeleton frame for each insulator surrounding the lead frame.

Then, by cutting the multiple lead frame for the semiconductor light emitting device by a cutting die, the semiconductor light emitting device can be singulated. Therefore, it is not necessary to cut by dicing and the production efficiency can further be improved.

The semiconductor light emitting device is excellent in heat radiation and can be easily applied to die molding for ensuring the sealing shape having intended optical characteristics.

The foregoing and other, features, aspects and advantages of the present embodiment will become more apparent from the following detailed description of the present embodiment when taken in conjunction with the accompanying drawings.

BRIEF DESCRIPTION OF THE DRAWINGS

FIG. 4 is a schematic diagram of a multiple lead frame of the first embodiment.

FIG. 5A is a plan view of a portion forming a lead frame in the semiconductor light emitting device, in a shape before surrounded by an insulator.

FIG. 5B is a cross-sectional view along line VB-VB shown in FIG. 5A.

FIG. 5C is a cross-sectional view along line VC-VC shown in FIG. 5A.

FIG. 5D is a cross-sectional view along line VD-VD shown in FIG. 5A.

DESCRIPTION OF THE PREFERRED EMBODIMENTS

In the following, based on the drawings, embodiments will be described. In the following description, the same or corresponding parts are denoted by the same reference numbers, and description thereof will not be repeated.

First Embodiment

Figure 1:
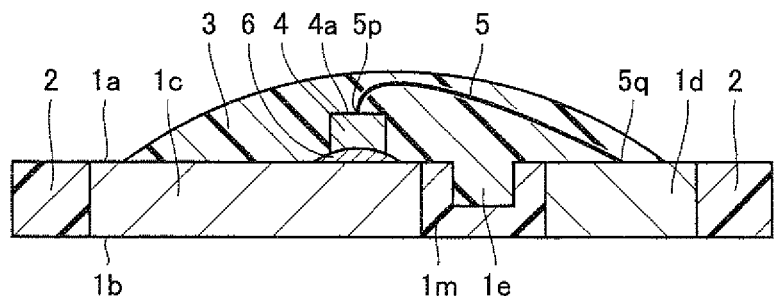
FIG. 1 is a schematic diagram showing a cross section of a semiconductor light emitting device of a first embodiment.
Figure 2:
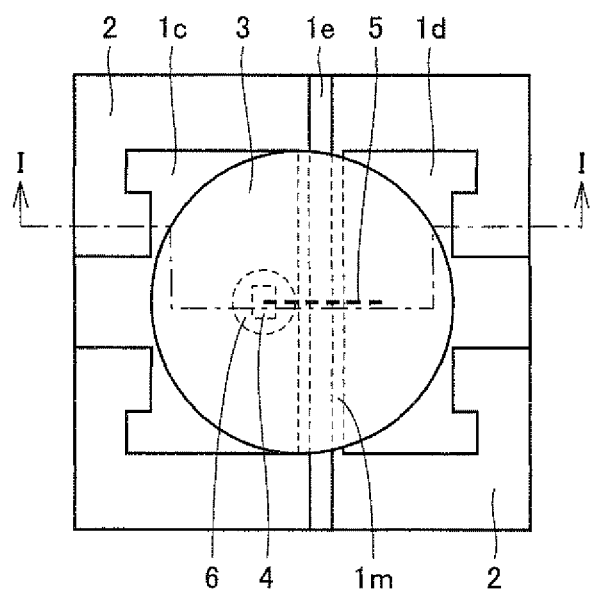
FIG. 2 is a plan view of the semiconductor light emitting device shown in FIG. 1.

As shown in FIGS. 1 and 2, a semiconductor light emitting device includes a lead frame 1 having a main surface 1a, a resin portion 2 as an insulator provided so as to surround lead frame 1 and to have the thickness not greater than that of lead frame 1, an LED chip 4 as a semiconductor light emitting element provided on main surface 1a, a metal wire 5, and a thermosetting resin 3 as a sealing resin provided so as to completely cover LED chip 4 and metal wire 5.

Lead frame 1 includes a semiconductor light emitting element mounting portion 1c having LED chip 4 mounted on main surface 1a. Lead frame 1 also includes a metal wire connecting portion 1d that is electrically connected to LED chip 4 by metal wire 5 and that extends over the same plane as semiconductor light emitting element mounting portion 1c. Semiconductor light emitting element mounting portion 1c and metal wire connecting portion 1d are surrounded by resin portion 2. Resin portion 2 forms the outer shape of the semiconductor light emitting device.

Semiconductor light emitting element mounting portion 1c and metal wire connecting portion 1d have plate-like shape, and are separated from each other by prescribed patterning. Between the separated semiconductor light emitting element mounting portion 1c and metal wire connecting portion 1d, a slit-like groove 1m is formed, which extends from main surface 1a to a rear surface 1b opposite to main surface 1a. Semiconductor light emitting element mounting portion 1c and metal wire connecting portion 1d are electrically insulated from each other by slit-like groove 1m which is filled with a resin material that is the same insulator as resin portion 2. That is, as will be described later, when resin portion 2 is filled with a resin material, slit-like groove 1m is filled with the same resin material with which resin portion 2 is filled.

LED chip 4 is provided on main surface 1a of semiconductor light emitting element mounting portion c. LED chip 4 is fixedly held on main surface 1a of semiconductor light emitting element mounting portion 1c with a conductive paste such as a silver (Ag) paste 6 interposed. An electrode provided on a top surface 4a of LED chip 4 (that is, the surface that is opposite to the surface facing lead frame 1 and that is on the upper side in FIG. 1) is connected by metal wire 5 made of, for example, gold (Au), to metal wire connecting portion 1d that is separated from semiconductor light emitting element mounting portion 1c by slit-like groove 1m. That is, LED chip 4 is electrically connected to main surface 1a by silver paste 6 and metal wire 5.

One end 5p of metal wire 5 connected to the electrode of LED chip 4 is formed in a ball-like shape. The other end 5q of metal wire 5 connected to metal wire connecting portion 1d is formed in a linear shape. Thus, metal wire connecting portion 1d and the other end 5q can be bonded by ball-bonding, and LED chip 4 and one end 5p can be bonded by wedge bonding. One end 5p of metal wire 5 is connected to LED chip 4 in a low-loop manner. This allows metal wire 5 to be provided more nearly to main surface 1a of lead frame 1, and therefore the amount of thermosetting resin 3 required to completely cover LED chip 4 and metal line 5 can be reduced.

When current is passed through LED chip 4, heat is generated together with light. The heat is conducted to semiconductor light emitting element mounting portion 1c, and therefrom radiated outside the semiconductor light emitting device such as a mounting substrate. In the present embodiment, by providing semiconductor light emitting element mounting portion 1c with a sufficient thickness, the heat generated in LED chip 4 can efficiently be diffused.

When plate-like lead frame 1 is thicker, the heat accumulation thereof is improved and the heat generated in LED chip 4 is diffused efficiently. However, due to limitations in processing, slit-like groove 1m becomes wider as lead frame 1 is thicker. That is, in order to avoid misalignment in assembling lead frame 1, high processing accuracy is required for lead frame 1. However, because it is difficult to require the processing accuracy of the size not greater than the thickness of a plate material in die mold processing, it is necessary to increase the width of slit-like groove 1m when lead frame 1 is designed to be thick. Accordingly, in order to reduce the semiconductor light emitting device in size, the thickness of the lead frame is to be about 1.5 mm, at a maximum.

In order to attain efficient heat radiation from lead frame 1, lead frame 1 is formed by a metal having heat conductivity of not smaller than 300 W/m·K. If the heat conductivity of the metal forming lead frame 1 is smaller than 300 W/m·K, the effect of lead frame 1 diffusing and radiating heat generated by LED chip 4 will be insufficient. Specifically, oxygen-free copper is most desirable for its high heat radiation performance (heat conductivity 391 W/m·K). On the other hand, for a certain structure and strength of lead frame 1, lead frame 1 can be formed with sufficient frame strength by employing a copper (Cu) alloy containing metal such as iron (Fe), zinc (Zn), nickel (Ni), chromium (Cr), lead (Pb), or silver (Ag), although the heat conductivity will be reduced. In the case where alloy is used, the heat conductivity of lead frame 1 can be increased with smaller amount of the metal added to copper (Cu).

FIG. 1 shows the semiconductor light emitting device having only one LED chip 4 mounted on lead frame 1. However, by patterning lead frame 1, a plurality of LED chips 4 may be mounted on a single semiconductor light emitting device. With the semiconductor light emitting device having a plurality of LED chip 4 mounted, a high-output light source can be obtained. Also, for example, if an LED chip is mounted for each of blue, green and red base colors, it is possible to obtain a light source of which color, such as white color, can be adjusted by adjusting current distribution to each of the LED chips.

When mounting a plurality of LED chips 4 on a single semiconductor light emitting device, it is necessary to reduce the width of slit-like groove 1m formed between semiconductor light emitting element mounting portion 1c and metal wire connecting portion 1d, to thereby reduce the semiconductor light emitting device in size. Because of limitations in processing, thicker lead frame 1 results in wider slit-like groove 1m. Accordingly, by reducing the thickness (for example, about 0.15 mm) of the lead frame 1 and narrowing groove 1m, the semiconductor light emitting device that is small and on which a plurality of LED chips 4 can be mounted can be formed.

Resin portion 2 is molded so as to surround lead frame 1 (semiconductor light emitting element mounting portion 1c and metal wire connecting portion 1d). Resin portion 2 is molded so as not to protrude on main surface 1a and rear surface 1b of lead frame 1, and so as to have the thickness not greater than that of lead frame 1. For allowing resin portion 2 to have increased surface area contacting lead frame 1 and to attain wedge effect, appropriate locations of main surface 1a and rear surface 1b of lead frame 1 are processed, into which resin is inserted to form resin portion 2. Thus, peeling or disconnection of resin portion 2 can be prevented, and the strength of the product can be improved. The product strength can also be improved by using lead frame 1 of a contour strip (that is, lead frame 1 having uneven thickness) produced by die molding of a copper or copper alloy strip of varying thickness, and molding resin portion 2 so as to surround the entire lead frame 1. On rear surface 1b of lead frame 1, a terminal portion for connecting the semiconductor light emitting device to a mounting substrate or the like is provided.

As the insulator with which resin portion 2 is filled, a material excellent in heat resistance is used, taking into account of a reflow step in manufacturing. Desirably, it is formed by a white material having a high reflectivity, to efficiently reflect the light generated by LED chip 4. Further desirably, a material that is not degraded by the light from LED chip 4 and that has a thermal expansion coefficient close to that of lead frame 1 is used. As a specific material satisfying such conditions, a thermoplastic resin such as liquid crystal polymer, a polyamide-based resin or the like may be used. A thermosetting resin such as epoxy resin may also be used as a material for forming resin portion 2. Ceramic such as alumina may also be used as a material for forming resin portion 2.

As shown in FIG. 1, thermosetting resin 3 as a sealing resin sealing LED chip 4 and metal wire 5 is molded into a dome-like shape. It is molded by die molding for ensuring its shape stability. When thermosetting resin 3 is molded by die molding, thermosetting resin 3 is uniformly molded among the singulated semiconductor light emitting devices. As to die molding, injection molding (for example, transfer molding), compression molding or the like may be possible, and die molding having the best moldability can be selected. In the present embodiment, sealing is performed by transfer molding.

In conventional thermosetting resin 3 molded by transfer molding, marks of runners are left around the molded shape. In thermosetting resin 3 molded by compression molding, marks of resin overflow are left around the molded shape.

Here, a depression 1e is formed at one surface, on main surface 1a side, of the resin arranged inside slit-like groove 1m. Depression 1e functions as a runner that is a flow channel for inserting a thermosetting material in transfer molding, and as an air vent that is a route for discharging air inside the die. Provision of depression 1e realizes a structure in which the resin runner and the air vent necessary for transfer molding are incorporated in the semiconductor light emitting device. Therefore, it is not necessary to separately provide the runner and the air vent when performing transfer molding. Accordingly, molding can be performed in such a manner that the marks of runners or air vents being cut are not left on thermosetting resin 3 molded in a dome-like shape.

The size of depression 1e for the resin runner for transfer molding can be changed depending on its die-moldability, product strength and optical design. That is, when particles such as fillers are contained in thermosetting resin 3 as a sealing resin, larger depression 1e provides better moldability. On the other hand, excessively large depression 1e reduces the volume of the resin with which slit-like groove 1m is filled and which connects semiconductor light emitting element mounting portion 1c and metal wire connecting portion 1d. Thus, the product strength of the semiconductor light emitting device is reduced, and the light emitted from LED chip 4 leaks outside. Accordingly, it is necessary to determine the size of depression 1e as appropriate, taking into account of the product strength and optical characteristics of the semiconductor light emitting device.

As a sealing resin sealing LED chip 4 and metal wire 5, thermosetting resin (for example, epoxy resin, silicone resin or the like) can be used. By the shape of thermosetting resin 3, the intended optical characteristics can be provided to the light generated by LED chip 4. By using resin of high index of refraction as the sealing resin, for certain optical characteristics required for the semiconductor light emitting device, it is possible to dispense with a reflector conventionally provided to the outer circumferential portion of a conventional semiconductor light emitting device.

Specifically, as shown in FIG. 1, by shaping the sealing resin in a dome-like shape, the directivity angle of the light emitted from LED chip 4 becomes small (that is, divergence of the light is suppressed). Conversely, for a product that does not require directivity characteristics, sealing can be performed with the sealing resin in a cylindrical shape.

Further, the sealing resin plays the role of protecting LED chip 4 and metal wire 5 from external physical or electrical contact.

Figure 3:
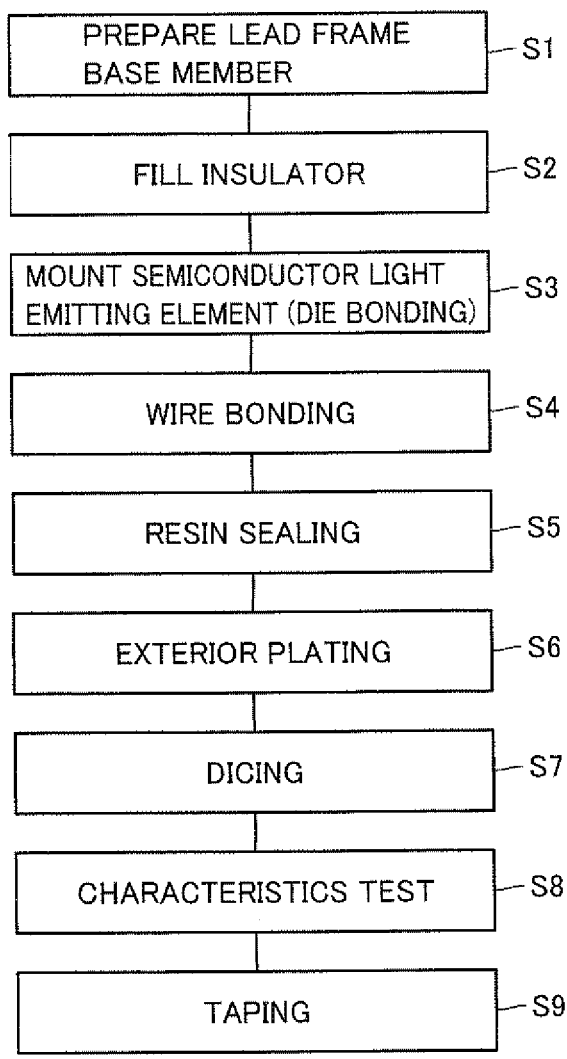
FIG. 3 is a flowchart showing a manufacturing method of the semiconductor light emitting device of the first embodiment.

Next, a manufacturing method of the semiconductor light emitting device shown in FIG. 1 is described. As shown in FIG. 3, first, in step (S1), a metal plate is patterned into a prescribed shape by appropriate processing means such as punch press processing, etching processing or the like, and thereby a lead frame base member is prepared. Lead frame base member 201 shown in FIG. 4 is formed by a plurality of lead frames 1 each constituting a semiconductor light emitting device. Lead frame base member 201 includes support frames 202 being the opposing edges of lead frame base member 201 and a plurality of skeleton frames 203 bridging between support frames 202 to form a skeleton structure. The portion forming semiconductor light emitting element mounting portion 1c and the portion forming metal wire connecting portion 1d in the semiconductor light emitting device shown in FIG. 1 are separated from each other in lead frame base member 201, and held as suspended by adjacent skeleton frames 203.

Here, taper processing or groove processing as a wedge structure for preventing peeling of the insulator can be provided to lead frame base member 201. FIGS. 5A to 5D show one of the regions enclosed by the alternate long and two short dashes line in FIG. 4, which is the portion forming lead frame 1 in the semiconductor light emitting device and in the shape before surrounded by an insulator. As shown in FIGS. 5A to 5D, at appropriate portions of main surface 1a and rear surface 1b of lead frame 1, taper processing or groove processing is provided to form a wedge structure 1f. Thus, the contact area between lead frame 1 and resin portion 2 when being filled with resin portion 2 surrounding lead frame 1 is increased. That is, wedge structure 1f is the structure that increases the contact area between lead frame 1 and resin portion 2 as an insulator, by increasing the surface area of lead frame 1 by processing the surface of lead frame 1. Inserting resin into such wedge structure 1f provides a wedge effect of preventing peeling or disconnection of resin portion 2 from lead frame 1.

Next, in step (S2), a resin base member 207 to be resin portion 2 as an insulator constituting the semiconductor light emitting device is formed. Resin base member 207 is formed by filling resin into all the gaps that are formed to surround the portion forming lead frame 1 in lead frame base member 201. Resin base member 207 can be formed by insert molding, for example.

Here, a gap between the portion forming semiconductor light emitting element mounting portion 1c and the portion forming metal wire connecting portion 1d in the semiconductor light emitting device (that is, the portion corresponding to slit-like groove 1m in the semiconductor light emitting device) is also filled with resin. Accordingly, in the semiconductor light emitting device shown in FIG. 1, resin portion 2 and slit-like groove 1m are filled with the same resin.

Resin base member 207 is molded so as to have the thickness not greater than the thickness of lead frame base member 201. At the time point where step (S2) is completed, lead frame base member 201 and resin base member 207 are formed so as to be one substrate.

Next, in step (S3), a conductive paste such as thermosetting silver paste 6 is applied to the surface of lead frame base member 201, which surface corresponds to main surface 1a of the portion forming semiconductor light emitting element mounting portion 1c in the semiconductor light emitting device. Then, die bonding is performed, in which LED chip 4 as a semiconductor light emitting element is mounted on main surface 1a with the conductive paste interposed.

Next, in step (S4), wire bonding is performed. In wire bonding, electrodes of the mounted LED chips 4 and the surface corresponding to main surface 1a of the portion forming metal wire connecting portion 1d in the semiconductor light emitting device are electrically connected to each other by metal wire 5 that is produced by gold (Au) having a diameter of 20-30 µm, for example. Thus, an electric circuit is formed and the semiconductor light emitting device is rendered conductive.

In step (S5), sealing with resin is performed so that LED chip 4 and metal wire 5 are completely covered, and the electric circuit is protected as being shielded from the outside air. The resin used as the sealing member is thermosetting resin, and a transparent resin of epoxy-based, silicone-based or the like can be used. When the semiconductor light emitting device is a white illumination, a resin containing phosphor such as Gd and Ce doped YAG (Yttrium-Aluminum-Garnet)-based phosphor can be used as the sealing resin.

Here, the sealing resin is molded by die molding using liquid or solid resin. Therefore, the sealing resin can easily be molded into a shape based on the intended optical characteristics for the light generated by LED chip 4, such as dome-like shape shown in FIG. 1, and the shape stability of the sealing resin can be ensured. Since resin is allowed to cure inside the die, the conventional problems in liquid resin sealing can be suppressed, such as variations in the dropping amount attributed to a change in viscosity or the like and variations in the sealing shape attributed to vaporization of volatile component during curing or cure shrinkage.

Next, in step (S6), plating processing is provided to the rear surface of lead frame base member 201 (to the portion corresponding to rear surface 1b contacting the mounting substrate when the semiconductor light emitting element is mounted on the mounting substrate, in the semiconductor light emitting device shown in FIG. 1). Plating processing can be performed using tin (Sn) and bismuth (Bi) plating, or tin (Sn) and lead (Pb) plating (solder plating), for example. At the time point where step (S6) is completed, multiple lead frame 200 having a plurality of semiconductor light emitting devices arranged in a matrix, as shown in FIG. 4, is completed.

Next, in step (S7), a dicing apparatus is used to cut multiple lead frame 200 along the outer shape of the semiconductor light emitting devices arranged in a matrix (i.e., along the alternate long and two short dashes line in FIG. 4). Thus, the singulation is performed, where the plurality of semiconductor light emitting devices are cut from multiple lead frame 200, each being separated into a single semiconductor light emitting device having single lead frame 1 and resin portion 2 surrounding lead frame 1. Thereafter, in step (S8), a step of testing the semiconductor light emitting devices is performed. Thereafter, in step (S9), a taping step where the semiconductor light emitting devices are prepared in a prescribed shipment condition is performed.

As to the heat radiating performance of the semiconductor light emitting device described as above, the heat generated when LED chip 4 emits light is firstly absorbed by semiconductor light emitting element mounting portion 1c having very high thermal conductivity, and thereafter radiated to the substrate and the like where the semiconductor light emitting element is mounted. Since the heat generated by LED chip 4 as a semiconductor light emitting element can efficiently be radiated to the outside, the temperature of LED chip 4 is reduced and the temperature of the sealing resin covering LED chip 4 can also be suppressed. Thus, even when LED chip 4 generates heat as a large current is passed for ensuring high luminance of the semiconductor light emitting device, reduction in light emitting efficiency or thermal degradation, which occurs when phosphor being held as dispersed in the sealing resin is subjected to high temperature, can be prevented. Further, the life of the semiconductor light emitting device can be extended. Still further, variations in color of the light emitted from LED chip 4 can be suppressed.

In molding the sealing resin, in the semiconductor light emitting device of the first embodiment, the thickness of resin portion 2 is not greater than the thickness of lead frame 1, and there are no protrusions on main surface 1a and rear surface 1b of lead frame 1. Therefore, the sealing resin can easily be molded by die molding, and the sealing shape can more freely be modified for certain product characteristics. At the same time, sealing with small variation in the shape of the sealing resin can be attained. Further, for a certain semiconductor light emitting element, by employing resin of high index of refraction, sufficient optical characteristics can be obtained without using a reflector. As a result, the product height of the semiconductor light emitting element can be reduced.

Further, by providing depression 1e for the runner and air vent of injection molding in the resin arranged inside slit-like groove 1m, the runner and the air vent can be incorporated in the semiconductor light emitting device. When the shape of the sealing resin is reduced in size, it is difficult to surely provide the resin runner and the air vent, and the moldability is affected. On the other hand, when the resin runner and the air vent are increased in size, cutting marks of the runner or the air vent will be left on the molded shape of the sealing resin. By providing the runner and air vent for sealing resin in the resin arranged inside slit-like groove 1m, it becomes possible to perform die molding which does not leave cutting marks of the runner and air vent on the sealing resin.

Second Embodiment

Figure 6:
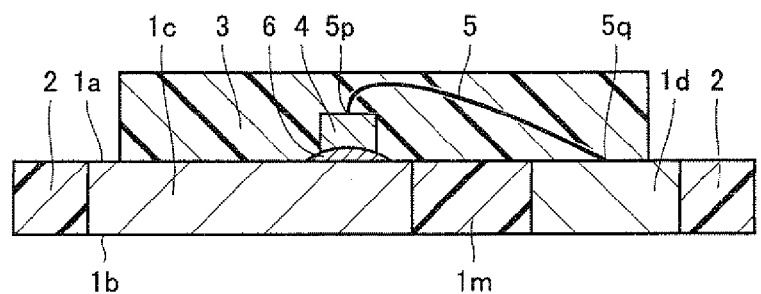
FIG. 6 is a schematic diagram showing a cross section of a semiconductor light emitting device of a second embodiment.

As shown in FIG. 6, a semiconductor light emitting device of a second embodiment is different from the semiconductor light emitting device of the first embodiment shown in FIG. 1 in the shape of thermosetting resin 3 as a sealing resin and the shape of the resin arranged inside slit-like groove 1m.

Specifically, thermosetting resin 3 is molded into a cylindrical shape. In the second embodiment, thermosetting resin 3 is molded by dam-sheet molding. On the surface, on main surface 1a side, of the resin arranged inside slit-like groove 1m, depression 1e for runner and air vent of injection molding is not formed.

As used herein, the dam-sheet molding refers to a method of molding thermosetting resin, wherein a sheet made of silicone, Teflon (registered trademark) or the like having a hole (a dam sheet) is attached to a lead frame, into which hole resin is poured by potting method. In this state, the resin is thermally cured. Thereafter, the dam sheet is peeled off to leave only the thermosetting resin on the lead frame.

As thermosetting resin 3 as a sealing resin sealing LED chip 4 and metal wire 5 is inserted by potting method into the hole formed in the dam sheet, it is not necessary to provide depression 1e for runner and air vent of injection molding. With the semiconductor light emitting device of the second embodiment configured as above, while the shape of the sealing resin is limited to the shape that can be molded by dam-sheet molding, such as a cylindrical shape, a die for injection molding is not necessary. With only the dam sheet, it can be manufactured with small capital investment. When filler or the like is contained in the sealing resin, the concentration of the filler in the sealing resin tends to vary if molding is performed by injection molding. On the other hand, by dam-sheet molding, variations in the filler concentration can be suppressed by dropping the sealing resin while agitating the resin in a syringe.

In thermosetting resin 3 molded by dam-sheet molding (potting molding), being different from the case of die molding, there are no marks of resin runner or overflow, or marks of cut away runners or overflow resin around the molded shape. In the semiconductor light emitting device in which thermosetting resin 3 is molded by dam-sheet molding, the molded shape of thermosetting resin 3 is varied among the singulated semiconductor light emitting devices (that is, the amount of sealing resin is not constant).

The other configuration and manufacturing steps of the semiconductor light emitting device of the second embodiment are the same as described in the first embodiment, and therefore description thereof is not repeated.

Third Embodiment

Figure 7:
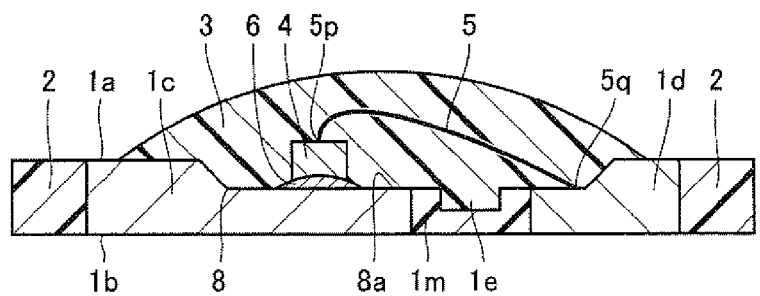
FIG. 7 is a schematic diagram showing a cross section of a semiconductor light emitting device of a third embodiment.
Figure 8:
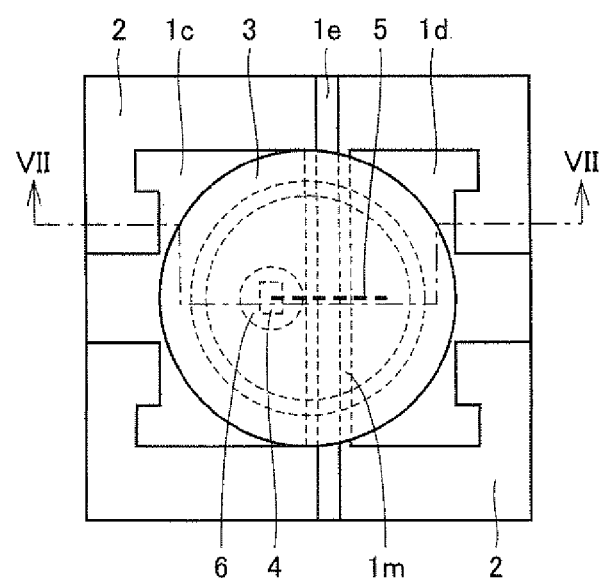
FIG. 8 is a plan view of the semiconductor light emitting device of the third embodiment shown in FIG. 7.

As shown in FIGS. 7 and 8, a semiconductor light emitting device of a third embodiment is different from the semiconductor light emitting device of the first embodiment shown in FIGS. 1 and 2 in the shape of main surface 1a of lead frame 1.

Specifically, on main surface 1a, concave portion 8 is formed over semiconductor light emitting element mounting portion 1e, slit-like groove 1m, and metal wire connecting portion 1d. LED chip 4 as a semiconductor light emitting element is mounted on semiconductor light emitting element mounting portion 1c with silver paste 6 interposed, at bottom surface 5a of concave portion 8. To bottom portion 5a of concave portion 8 in metal wire connecting portion 1d, metal wire 5 extending from the top surface of LED chip 4 is connected. The side wall of concave portion 8 is formed to be tilted such that the opening area of concave portion 8 on the same plane as main surface 1a is greater than the area of bottom surface 5a of concave portion 8.

In FIG. 7, depression 1e for runner and air vent is formed on the surface, on main surface 1a side, of the resin arranged inside slit-like groove 1m is formed for forming thermosetting resin 3 as a sealing resin by injection molding. As described in the second embodiment, depression 1e is not necessary when sealing is performed by dam-sheet molding. With the semiconductor light emitting device configured as above, the same effect as described in the first embodiment can be obtained. In addition, by providing LED chip 4 to bottom surface 5a of concave portion 8, a product having the optical characteristics that cannot be controlled solely by the shape of the sealing resin, in particular, having higher directivity characteristics than a semiconductor light emitting device without concave portion 8, can be obtained.

The other configuration and manufacturing steps of the semiconductor light emitting device in the third embodiment are the same as described in the first embodiment, and therefore description thereof is not repeated.

Fourth Embodiment

Figure 9:
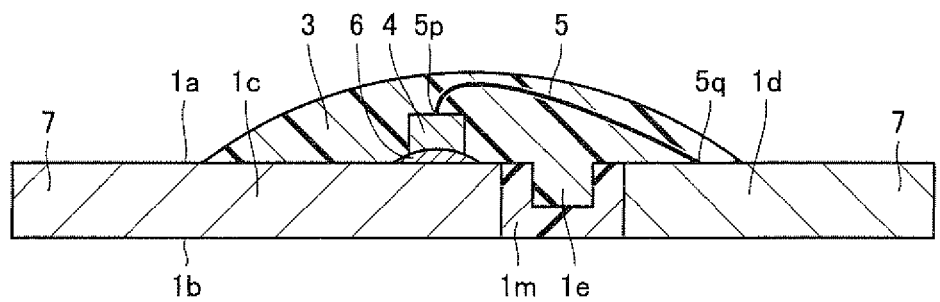
FIG. 9 is a schematic diagram showing a cross section of a semiconductor light emitting device of a fourth embodiment.
Figure 10:
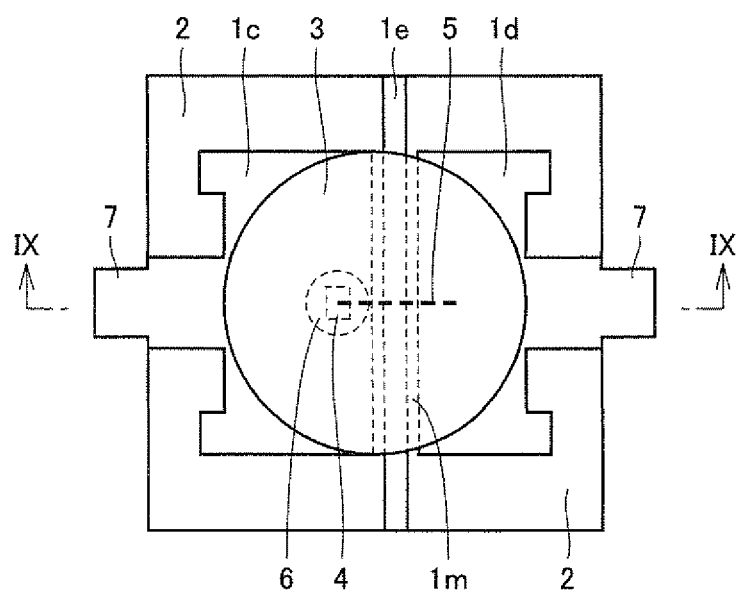
FIG. 10 is a plan view of the semiconductor light emitting device of the fourth embodiment shown in FIG. 9.

As shown in FIGS. 9 and 10, a semiconductor light emitting device of a fourth embodiment is different from the semiconductor light emitting device of the first embodiment shown in FIGS. 1 and 2 in that it includes a lead terminal 7 projecting from the periphery of resin portion 2 as an insulator into a side away from LED chip 4 as a semiconductor light emitting element.

In FIG. 9, depression 1e for runner and air vent is formed on the surface, on main surface 1a side, of the resin arranged inside slit-like groove 1m is formed for forming thermosetting resin 3 as a sealing resin by injection molding. As described in the second embodiment, depression 1e is not necessary when sealing is performed by dam-sheet molding.

In the fourth embodiment, resin portion 2 is formed so as to surround lead frame 1 in a limited manner with a minimum resin amount that ensures the product strength of the semiconductor light emitting device. The end portion of lead terminal 7 for connecting to a mounting substrate or the like is not surrounded by resin portion 2. The diameter of lead terminal 7 is formed as small as possible in a range where the product strength of lead frame 1 is ensured, taking into consideration of cutting by a die in a manufacturing step of the semiconductor light emitting device.

With the semiconductor light emitting device configured as above, the same effect as described in the first embodiment can be obtained. In addition, since lead terminal 7 is projecting from resin portion 2, cutting by a die, in addition to conventional dicing, is possible.

In the first to third embodiments where the lead terminal is surrounded by resin portion 2, metal is exposed at the cutting surface the lead terminal. Oxidation of the metal reduces wettability to solder. In the semiconductor light emitting device of the fourth embodiment, as lead terminal 7 projects toward outside (that is, into a side away from LED chip 4), margin for solder can be ensured not only at the cutting surface of lead terminal 7 but at the side surface thereof, and therefore reduction in wettability to solder can be prevented. Accordingly, when mounting the semiconductor light emitting device to a substrate or the like, excellent soldering to lead terminal 7 can be performed.

The other configuration of the semiconductor light emitting device of the fourth embodiment is the same as described in the first embodiment, and therefore detailed description thereof is not repeated.

Figure 11:
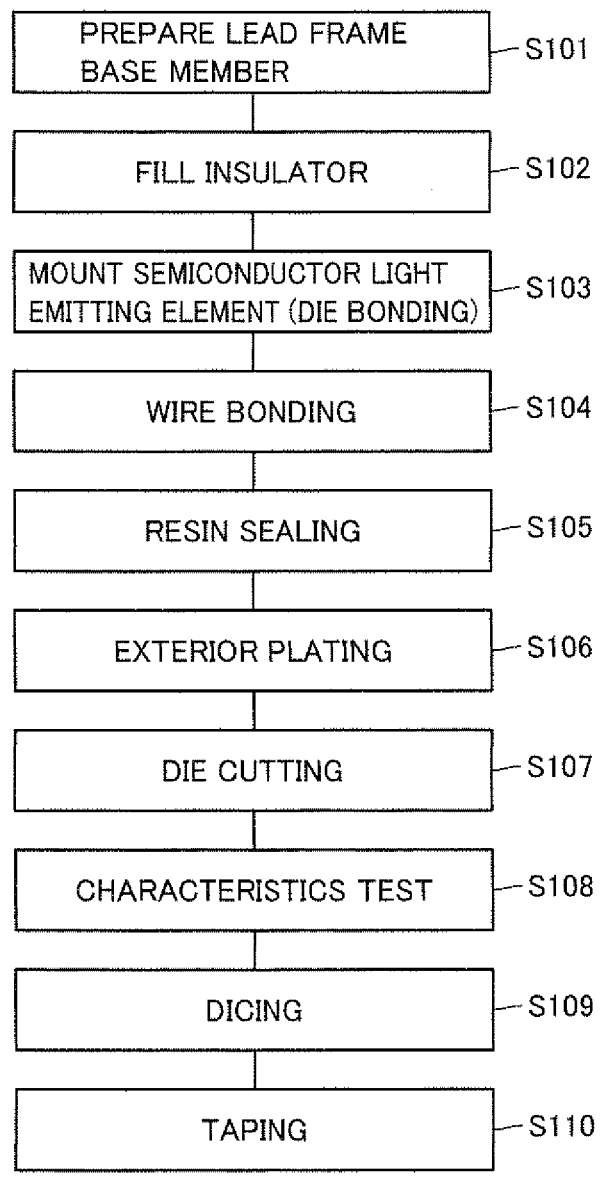
FIG. 11 is a flowchart showing a manufacturing method of the semiconductor light emitting device of the fourth embodiment.

Next, a manufacturing method of the semiconductor light emitting device of the fourth embodiment is described. Steps (S 101)-(S106) shown in FIG. 11 are similar to the steps (S1)-(S6) of the first embodiment shown in FIG. 3. In step (S101), to each of support frames (cradles) 202 of the opposing edges of lead frame base member 201, a key structure 205 is formed. Key structure 205 is provided in order to improve connecting force between lead frame base member 201 and resin base member 207, when resin base member 207 is formed as a gap surrounding a portion forming lead frame 1 in lead frame base member 201 is filled with resin.

In the subsequent step (S102), the gap formed so as to surround the portion forming lead frame 1 in lead frame base member 201 is filled with resin, whereby resin base member 207 is formed. Here, in multiple lead frame 200 of the fourth embodiment shown in FIG. 12, a groove structure 204 not being filled with resin is formed between resin base member 207 and skeleton frame 203, which is different from the first embodiment having a structure in which every gap is filled with resin. For example, when a gap is to be filled with resin by compression molding, groove structure 204 can be formed by providing a mask for preventing intrusion of resin.

That is, as described above, in the semiconductor light emitting device of the fourth embodiment, resin portion 2 surrounds lead frame 1 in a limited manner with a minimum resin amount that ensures the product strength, while the end portion of lead terminal 7 for connecting to a mounting substrate or the like is not surrounded by resin portion 2. Accordingly, the portion forming lead terminal 7 in lead frame base member 201 and skeleton frame 203 between resin base members 7 are not covered by resin. On the other hand, between two adjacent skeleton frames 203, resin base member 207 is formed so as to reach support frames (cradles) 202 of the opposing edge of lead frame base member 201.

Next, in step (S107), cutting by a cutting die is performed. The material of the cutting die may be a material generally used for a die for cutting a metal frame (such as cemented carbide). Since the end portion of LED terminal 7 on a side away from LED chip 4 is not covered by resin, cutting between columns of the multiple lead frame in the direction along skeleton frame 203 can be performed by a cutting die, instead of cutting by the dicing apparatus described in the first embodiment.

Figure 13:
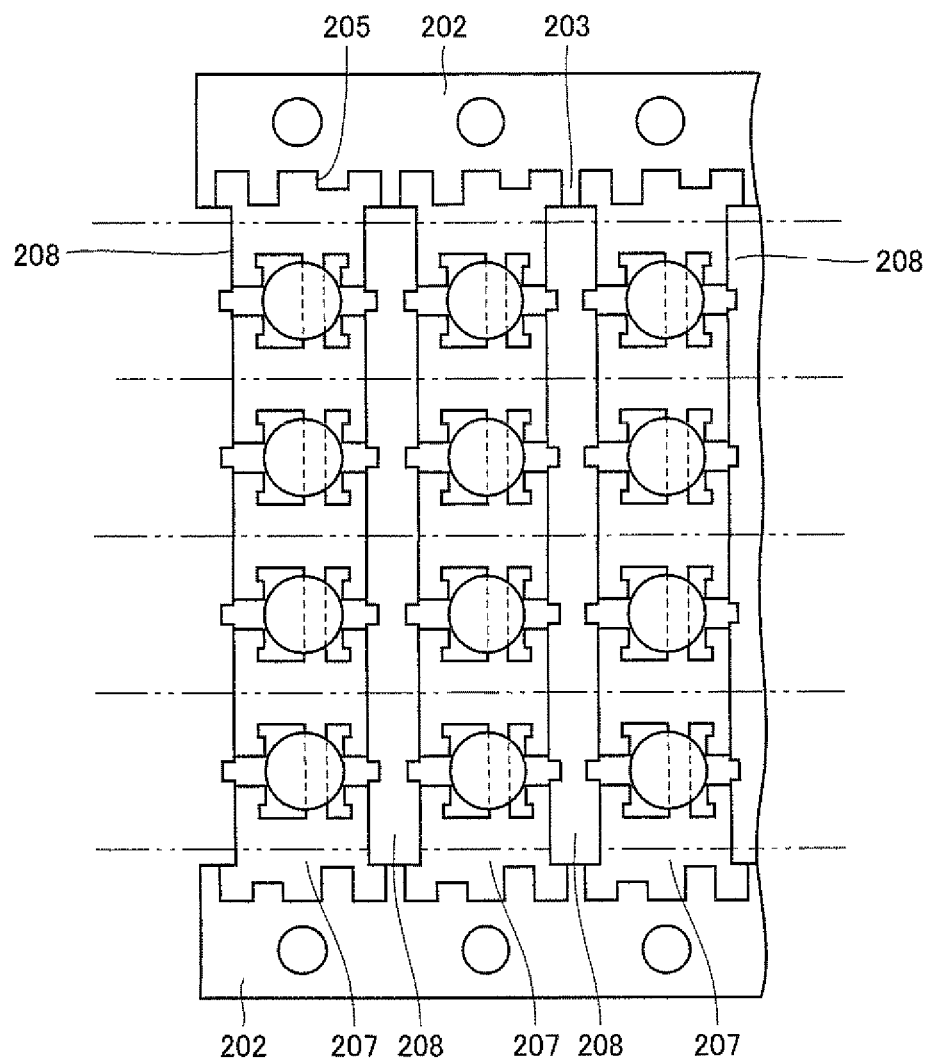
FIG. 13 is a schematic diagram showing a state where a punched portion is formed in the multiple lead frame.

As a result, as shown in FIG. 13, a punched portion 208 is formed in the portion where skeleton frame 203 has been formed. By punched portion 208, adjacent lead frames 1 surrounded by adjacent resin base members 207 are separated from each other. Since the joining force between lead frame base member 201 and resin base member 207 has been improved by key structure 205, even after skeleton frame 203 is cut by the cutting die, resin base member 207 is connected to support frame (cradle) 202.

In this state, while each semiconductor light emitting device is connected to support frame (cradle) 202 by resin base member 207, it is electrically independent. Accordingly, in the subsequent step (S108), it is possible to perform a semiconductor light emitting device characteristics test for each multiple lead frame. Thereafter, in step (S109), resin base member 207 is cut by the dicing apparatus, whereby the semiconductor light emitting device is singulated. The taping step of step (S110) is as described in the first embodiment.

According to the multiple lead frame for the semiconductor light emitting device and the manufacturing method of the semiconductor light emitting device of the fourth embodiment configured as described above, lead terminal 7 is cut by a die and the portion subjected to dicing is only resin base member 207. Therefore, cutting defects such as burr occurring when metal and resin are simultaneously subjected to dicing-cutting can be avoided. As groove structure 204 is formed in multiple lead frame 200, the force required for performing die cutting can be reduced, while the die can be simplified and the press machine can be reduced in size.

Alternatively, a press machine of comparable performance can produce greater pieces of semiconductor light emitting devices. Additionally, as described above, the characteristics test that has conventionally been performed after singulating the semiconductor light emitting devices can be performed for each multiple lead frame. Accordingly, the production efficiency of the semiconductor light emitting device can be improved.

Fifth Embodiment

Figure 15:
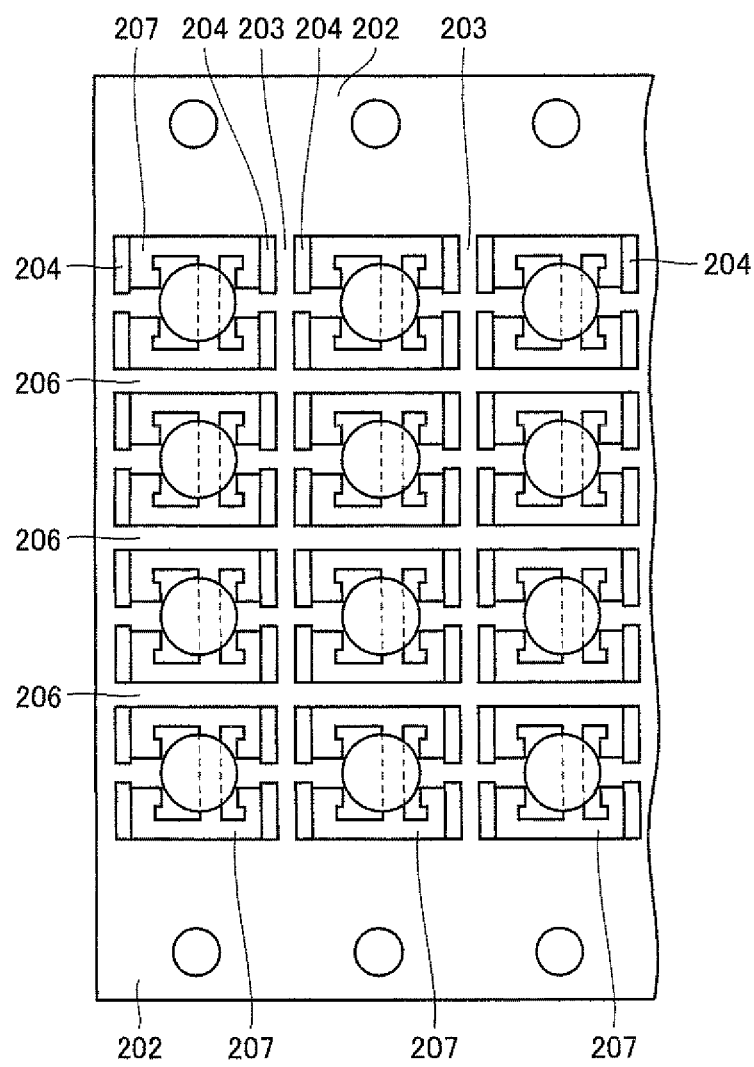
FIG. 15 is a schematic diagram of a multiple lead frame of the fifth embodiment.

In a fifth embodiment, another manufacturing method of a semiconductor light emitting device shown in FIGS. 9 and 10 is described. As shown in FIG. 15, a multiple lead frame for a semiconductor light emitting device is different from the fourth embodiment in that resin base member 207 exists only around the portion forming each lead frame 1, while each resin base member 207 is separated by skeleton frames 203 and 206. The adjacent semiconductor light emitting devices are not connected by resin base member 207.

That is, each resin base member 207 is divided for each insulator surrounding each lead frame 1 by skeleton frames 203 and 206. Resin base member 207 is limitedly present only around the portion forming each lead frame 1, and it is not connected to adjacent resin base member 207 forming adjacent lead frame 1.

Figure 14:
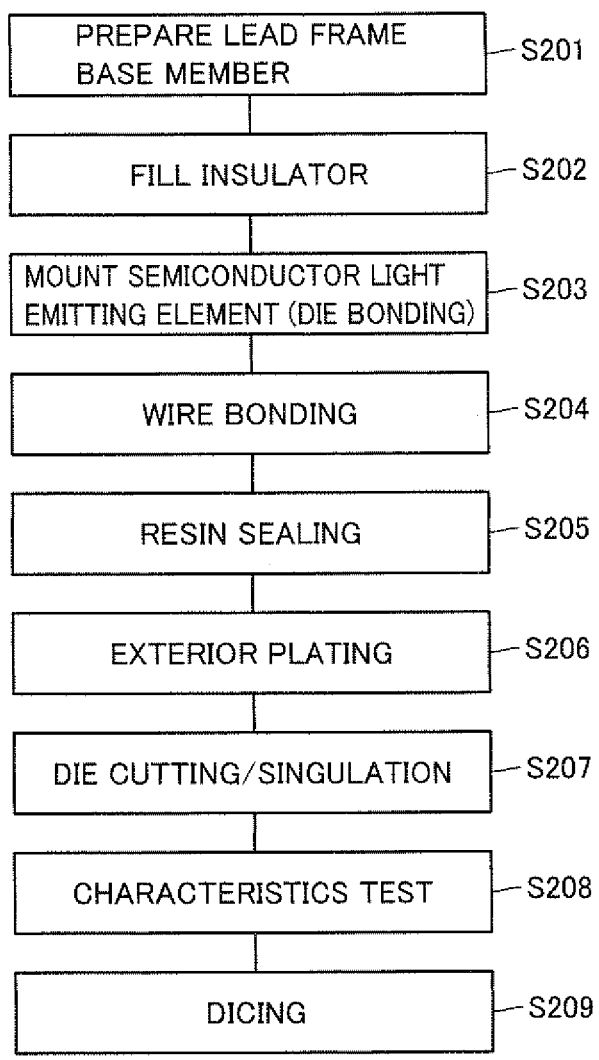
FIG. 14 is a flowchart showing a manufacturing method of a semiconductor light emitting device of the fifth embodiment.

With the multiple lead frame for the semiconductor light emitting device structured as above, it is only necessary to cut the end portion of lead terminal 7 in step (S207) shown in FIG. 14, and it is not necessary to dice resin portion 2. That is, comparing the flowchart of FIG. 14 with FIG. 11, it is different in that each semiconductor light emitting device is singulated in die cutting in step (S207), and that dicing step (S109) in FIG. 11 is omitted. Accordingly, since the process is shortened, the production efficiency of the semiconductor light emitting device can further be improved.

The other configuration and manufacturing steps of the semiconductor light emitting device of the fifth embodiment is the same as described in the first and fourth embodiments, and therefore description thereof is not repeated.

Sixth Embodiment

Figure 16:
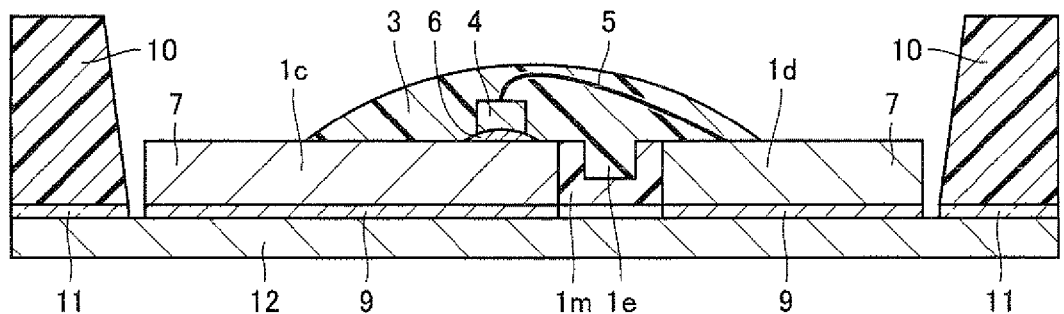
FIG. 16 is a schematic diagram showing a cross section of a semiconductor light emitting device of a sixth embodiment.

As shown in FIG. 16, a semiconductor light emitting device of a sixth embodiment is different from the semiconductor light emitting device of the fourth embodiment shown in FIG. 9 in that it further includes a reflector TO provided on a side away from LED chip 4 relative to the periphery of resin portion 2 and lead terminal 7.

Reflector 10 may be formed by white resin having a high reflectivity, to efficiently reflect the light generated by LED chip 4 and transmitted thermosetting resin 3. Also, similarly to resin portion 2, it may be formed by resin excellent in heat resistance, taking into account of a reflow step in manufacturing. In order to more efficiently reflect the light, the inner circumferential surface of reflector 10, that is the surface opposing to LED chip 4, may be plated with silver plating, nickel plating, or nickel-chromium plating, for example. Reflector 10 may be made of metal having high heat conductivity such as Al, Cu, Fe, or Mg. Reflector 10 may be connected, by an adhesive 11 made of transparent resin such as epoxy-based resin, to substrate 12 having the package formed by lead frame 1 and resin portion 2 mounted thereon, or it may be bonded to substrate 12 by an adhesive sheet. The inner circumferential surface of reflector 10 may be shaped to be part of circular conical surface elliptic conical surface, sphere, or paraboloid, so that light is efficiently emitted.

Figure 21:
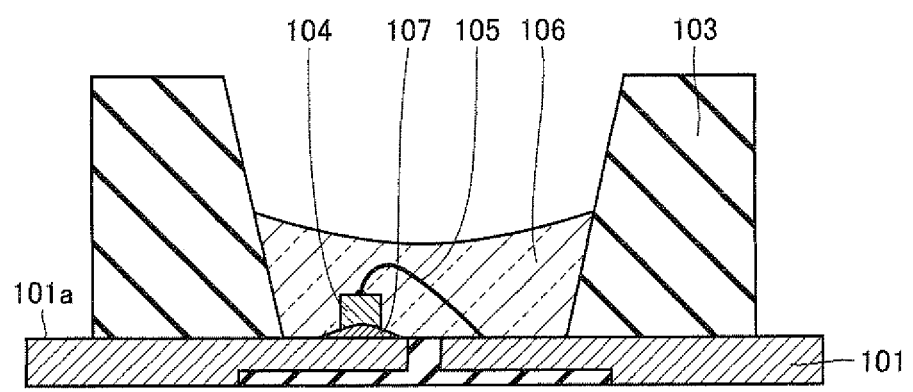
FIG. 21 is a schematic diagram showing a representative cross section of a conventional semiconductor light emitting device.

With the semiconductor light emitting device configured as above, the same effect as described in the fourth embodiment can be obtained. In addition, the optical characteristics that cannot be realized solely by the sealing shape of the sealing resin can be obtained, and at the same time, light extraction efficiency is also improved. As thermosetting resin 3 is molded by die molding or dam-sheet molding, reflector 10 and thermosetting resin 3 do not contact each other as in the conventional example shown in FIG. 21. That is, the conventional problem of peeling defect between reflector 10 and thermosetting resin 3 does not occur.

Figure 17:
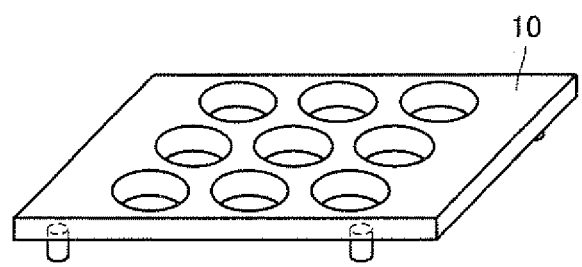
FIG. 17 is a perspective view showing a package of collective reflector.
Figure 18:
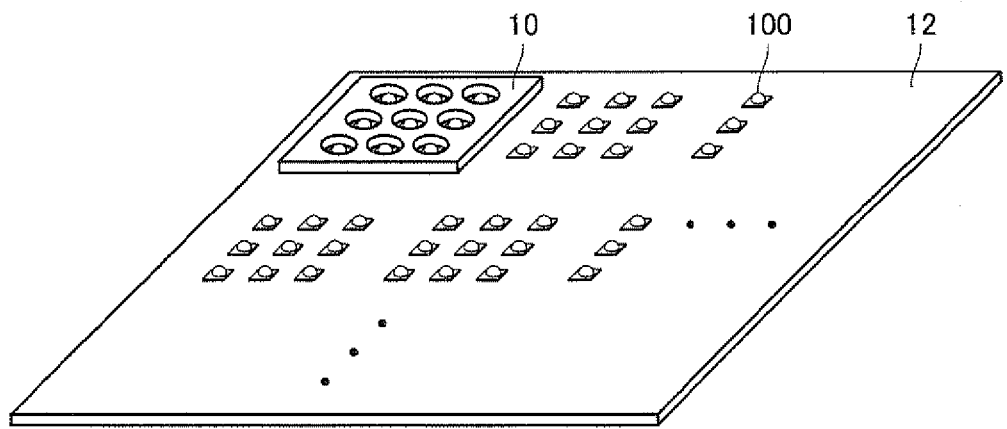
FIG. 18 is a perspective view showing a state where the package of reflector is placed on a mounting substrate.

Reflector 10 is provided to the outer circumferential portion of the semiconductor light emitting device. Accordingly, a package of collective reflector 10 as shown in FIG. 17 may be produced (the package is a plate-like base member provided with a plurality of through holes, the inner wall of the through hole being formed in the same shape as the inner circumferential surface of reflector 10). Then, only LED packages 100 already subjected to the characteristics test are mounted on mounting substrate 12. Thereafter, as shown in FIG. 18, the package of reflector 10 can be provided to the outer circumference of LED packages 100.

The other configuration and manufacturing steps of the semiconductor light emitting device of the sixth embodiment are the same as described in the first and fourth embodiments, and therefore description thereof is not repeated.

Seventh Embodiment

Figure 19:
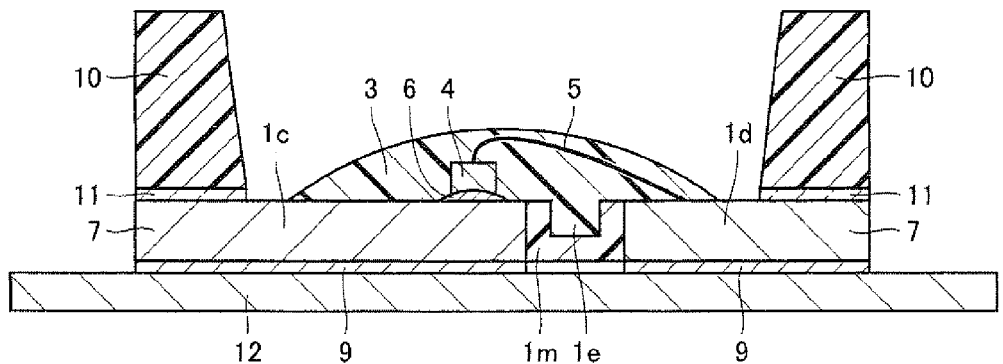
FIG. 19 is a schematic diagram showing a cross section of a semiconductor light emitting device of a seventh embodiment.

As shown in FIG. 19, a semiconductor light emitting device of a seventh embodiment is different from the semiconductor light emitting device of the sixth embodiment shown in FIG. 16 in that reflector 10 is provided on main surface 1a while avoiding contact with thermosetting resin 3 as a sealing resin.

Reflector 10 may be fixed on main surface 1a of lead frame 1 by adhesive 11, or may be fixed by an adhesive sheet. When adhesive 11 is employed, desirably adhesive 11 is sufficiently thin in a range where the adhesion strength is ensured, If adhesive 11 is thick, light leaks form adhesive 11 that is transparent resin, and the light extraction efficiency is reduced.

Figure 12:
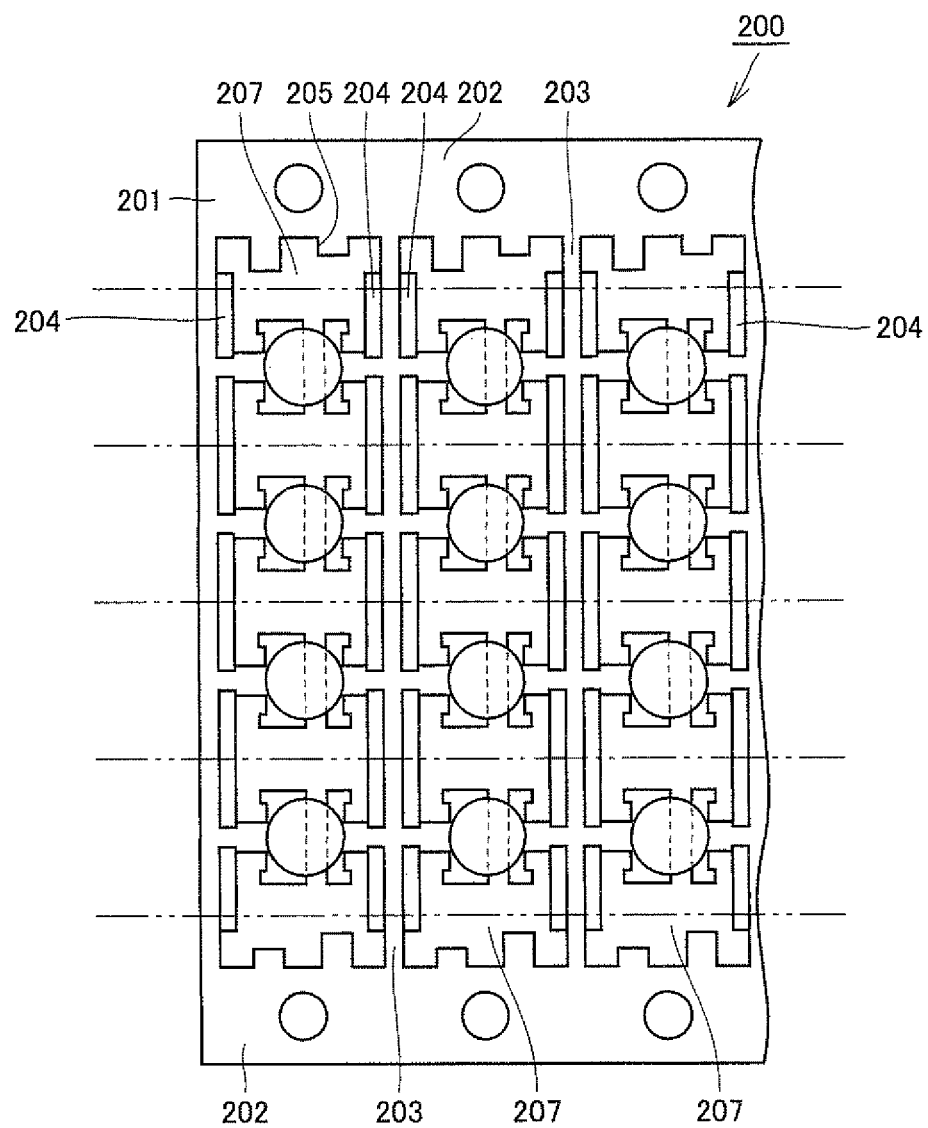
FIG. 12 is a schematic diagram of a multiple lead frame of the fourth embodiment.
Figure 20:
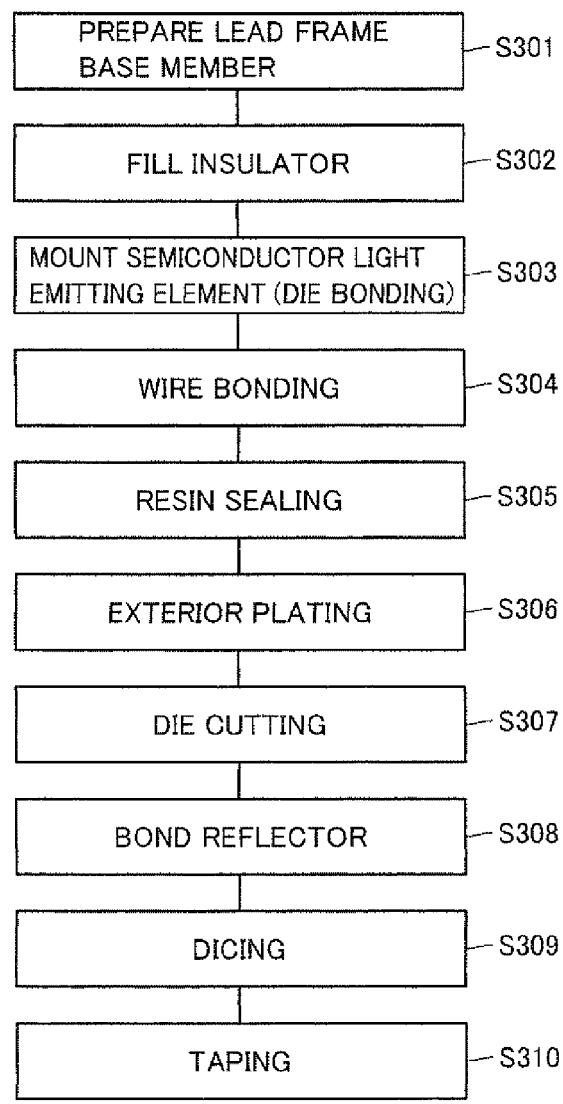
FIG. 20 is a flowchart showing a manufacturing method of the semiconductor light emitting device of the seventh embodiment.

In the semiconductor light emitting device of the seventh embodiment, the shape employed for the multiple lead frame is as shown in FIG. 12. The manufacturing method of the semiconductor light emitting device of the seventh embodiment shown in FIG. 20 is different from the flowchart of FIG. 11 in that, after die cutting is performed in step S307, in step (S308), the package of reflector 10 shown in FIG. 17 is bonded on main surface 1a of lead frame 1 by adhesive 11, and thereafter, in step (S309), resin base member 207 and reflector 10 are cut by dicing.

With the semiconductor light emitting device configured as above, the same effect as described in the fourth embodiment can be obtained. In addition, the optical characteristics that cannot be realized solely by the sealing shape of the sealing resin can be obtained. At the same time, since the distance between the inner circumferential surface of reflector 10 and LED chip 4 is shortened, the light can more efficiently be emitted to the outside, and hence light extraction efficiency is also improved. Furthermore, by bonding reflector 10 on main surface 1a, the outer shape of the semiconductor light emitting device can be maintained not only by resin portion 2 but also by reflector 10. This improves the product strength of the semiconductor light emitting device. Thus, by reducing the thickness of lead frame 1 and narrowing the distance of slit-like groove 1m, it becomes possible to attain multi-chip configuration (i.e., mounting a plurality of semiconductor light emitting devices on a mounting substrate) while keeping the size of the semiconductor light emitting devices small.

The other configuration and the manufacturing steps of the semiconductor light emitting device of the seventh embodiment are the same as described in the first and fourth embodiments, and therefore description thereof is not repeated.

Although the present embodiment has been described and illustrated in detail, it is clearly understood that the same is by way of illustration and example only and is not to be taken by way of limitation, the scope of the present embodiment being interpreted by the terms of the appended claims.

What is claimed is:

1. A semiconductor light emitting device, comprising:
   a lead frame including a plate-like semiconductor light emitting element mounting portion having a semiconductor light emitting element mounted on a main surface, and a plate-like metal wire connecting portion extending over a same plane as said semiconductor light emitting element mounting portion;
   a metal wire electrically connecting said semiconductor light emitting element and said metal wire connecting portion;
   a sealing resin so as to completely cover said semiconductor light emitting element and said metal wire; and
   an insulator provided along an exterior periphery of said lead frame, and having a thickness not greater than a thickness of said lead frame, wherein:
   between said semiconductor light emitting element mounting portion and said metal wire connecting portion, a slit-like groove is formed, which extends from a main surface of said lead frame to a rear surface of said lead frame opposite to the main surface; and
   at least one of said plate-like semiconductor light emitting element mounting portion and said plate-like metal wire connecting portion has a wedge structure formed inside said plate-like semiconductor light emitting element mounting portion and said plate-like metal wire connecting portion defined along a cross-sectional view, for preventing said insulator from peeling, formed on a periphery of said at least one of said plate-like semiconductor light emitting element mounting portion and said plate-like metal wire connecting portion in an area other than in a surface of said slit-like groove.

2. The semiconductor light emitting device according to claim 1, wherein
   said insulator is thermoplastic resin or thermosetting resin.

3. The semiconductor light emitting device according to claim 1, wherein
   a concave portion is formed at least at said semiconductor light emitting element mounting portion on said main surface of said lead frame, and
   said semiconductor light emitting element is mounted on a bottom surface of said concave portion.

4. The semiconductor light emitting device according to claim 1, wherein
   said wedge structure is provided in a tapered shape or groove shape.

5. The semiconductor light emitting device according to claim 1, further comprising
   a lead terminal projecting from periphery of said insulator into a side away from said semiconductor light emitting element.

6. The semiconductor light emitting device according to claim 1, further comprising
   a reflector provided on said main surface so as not to contact said sealing resin.

7. The semiconductor light emitting device according to claim 1, further comprising
   a reflector provided on a side away from said semiconductor light emitting element relative to periphery of said insulator.

8. A multiple lead frame for a semiconductor light emitting device used for the semiconductor light emitting device according to claim 1, said multiple lead frame for the semiconductor light emitting device being formed into a substrate-like form that includes
   a lead frame base member, formed by a plurality of said lead frames constituting said semiconductor light emitting device, and
   an insulator base member, with which gaps formed in said lead frame base member so as to surround said lead frame are filled, and which is to be said insulator constituting said semiconductor light emitting device, wherein
   a groove structure not being filled with said insulator base member is formed in part of said gaps.

9. A multiple lead frame for a semiconductor light emitting device used for the semiconductor light emitting device according to claim 1, said multiple lead frame for the semiconductor light emitting device being formed into a substrate-like form that includes
   a lead frame base member, formed by a plurality of said lead frames constituting said semiconductor light emitting device, and
   an insulator base member, with which gaps formed in said lead frame base member so as to surround said lead frame are filled, and which is to be said insulator constituting said semiconductor light emitting device, wherein
   said lead frame base member has a skeleton frame, and
   said insulator base member is divided by said skeleton frame for each said insulator surrounding said lead frame.

* * * * *